Dec. 11, 1962 H. A. WAGNER 3,068,382

HERMETICALLY SEALED SEMICONDUCTOR DEVICES

Filed May 23, 1960

WITNESSES

Edwin E. Bassler

Raymond F. Majesko

INVENTOR

Howard A. Wagner

BY

Frederick Shapoe

ATTORNEY

United States Patent Office 3,068,382
Patented Dec. 11, 1962

3,068,382
HERMETICALLY SEALED SEMICONDUCTOR DEVICES

Howard A. Wagner, Churchill Boro, Allegheny County, Pa., assignor to Westinghouse Electric Corporation, East Pittsburgh, Pa., a corporation of Pennsylvania
Filed May 23, 1960, Ser. No. 31,071
6 Claims. (Cl. 317—234)

The present invention is concerned with improvements in or relating to sealed semiconductor devices.

Heretofore, there has been difficulty in providing a suitable hermetic encapsulating means comprising insulating means for electrical semiconductor components. In the fabrication of these encapsulated members, hereinafter referred to as header members, a glass bead or sleeve has been used to provide an insulating means for the electrical leads to the semiconductor component. However, since the glass sleeve should be in compression at all times for good mechanical properties, certain types of rectifiers, especially high voltage types, are difficult to fabricate since only a relatively small area of the glass sleeve can be adequately compressed. Accordingly, creepage paths have been short in such prior art devices.

An object of the present invention is to provide a header member for a sealed electrical device comprising an open-ended cylindrical, insulating ceramic member soldered to widely separated metal portions.

Another object of the invention is to provide a reliable hermetically sealed electrical device in which a support of a good electrically and thermally conductive metal mounting an electrical component, such as a semiconductor member, is provided with an inserted ferrous base metal ring to which a header comprising a sleeve-like cylindrical ceramic insulating member soldered to widely separated metal portions to provide a long creepage path is welded without developing temperatures sufficient to deteriorate the electrical component.

Other objects of the invention will, in part, be obvious and will, in part, appear hereinafter.

For a better understanding of the nature and objects of the invention, reference should be had to the following detailed description and drawing, in which.

In accordance with the present invention and in attainment of the foregoing objects, there is provided a hermetically sealed electrical device having a good thermally conductive support member of a metal selected from the group consisting of copper, copper base alloys, silver, silver base alloys, and aluminum and aluminum base alloys. The support member has a flat surface mounting portion to which an electrical semiconductor component may be brazed or soldered. Thereafter, a header member comprising an open-ended, sleeve-like cylindrical ceramic insulating member with an apertured cap member soldered to the exterior of one end and a metallic annular member having a laterally extending flange at the lower end thereof, soldered to the exterior of the other end of the ceramic member is welded to the support member at the flange to provide a hermetic enclosure for the electrical component between the header member and the support member.

A long creepage path across the exterior walls of the cylindrical ceramic member is present between the apertured cap and the annular member. The parts can be readily shaped and proportioned so that the amount of heat developed during welding is insufficient to deteriorate the electrical component.

Figure 1:
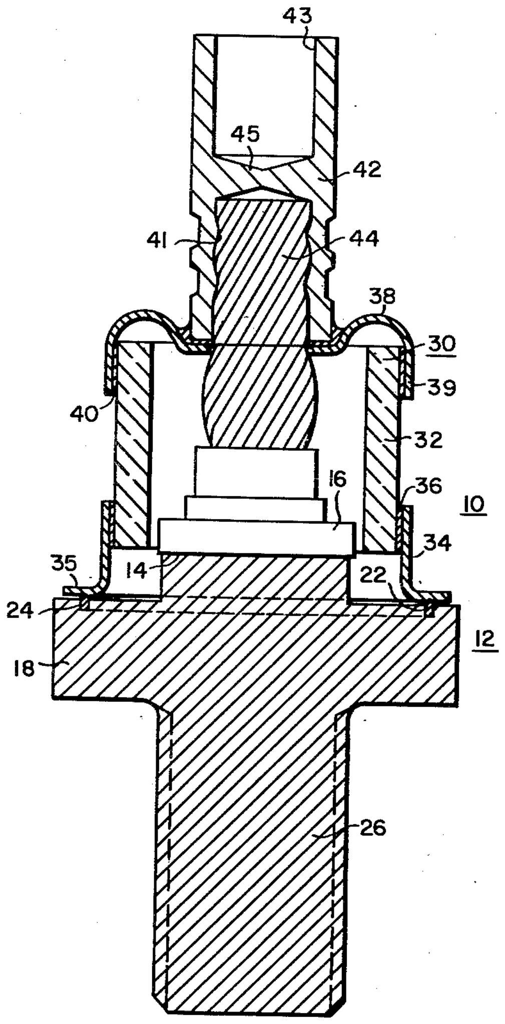
FIGURE 1 is a vertical section of a complete sealed electrical device.

Referring to FIG. 1, the hermetically sealed electrical device 10 according to the invention comprises a thermal conductor, electrical contact and support member 12 of a metal selected from the group consisting of copper, copper base alloys, silver, silver base alloys, aluminum, and aluminum base alloys. Copper and brass have been found particularly satisfactory for this purpose. The support member 12 comprises a centrally disposed flat surface mounting portion 14 to which an electrical component 16, for example, a semiconductor member, may be soldered so that electrical current may be easily conducted thereto and heat may be readily dissipated therefrom to the support member and thence to a heat sink. The electrical component is adversely affected by heating to a temperature above a predetermined level. The mounting portion 14 is circumscribed by a peripheral flange 18. A circular ring member 22 preferably of a ferrous base metal, such as carbon steel, fabricated from half rounds or cut from tubing is inserted into a circular groove 24 in the flange 18 and is soldered or brazed thereto providing a hermetic joint therebetween. The ring 22 presents a relatively narrow projection extending above the flange surface.

The ceramic sleeve may be composed of electrical grade porcelain, both high alumina (above 85%) and zircon porcelains being particularly good. However, steatite and cordierite porcelains may be employed with success.

From the opposite surface of the support member an electrical contact and thermal dissipating stud 26 projects, and it may be threaded to enable connecting of the support member to an electrical conductor and heat sink.

The ring member 22 and the electrical component 16 are usually soldered to the support member concurrently. The solders employed are preferably hard solders, such as silver base solders and gold base solders. An electrical component lead 44 may then be soldered to the electrical component 16.

Figure 2:
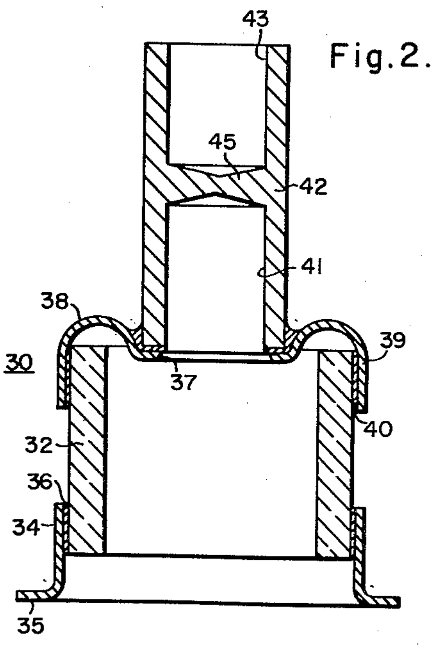
FIG. 2 is a vertical section of a header member for a sealed electrical device.

Referring to FIG. 2, the header member 30 comprises an open-ended cylindrical ceramic member 32. A metallic annular member 34 having a laterally extending flange 35 at the lower end thereof is hermetically joined to the exterior of the lower end of the cylindrical ceramic member by means of a hard solder 36, such as silver solder, the flange extending below the end of the cylindrical ceramic member. The annular member may consist of a metal such as copper, copper base alloys, silver, silver base alloys, aluminum, aluminum base alloys, ferrous base alloys and nickel-iron-cobalt alloy, known as Kovar. A cap member 38, of steel or Kovar alloy, having a central aperture 37 and a downwardly extending skirt 39 is hard-soldered by solder 40 to the exterior of the upper end of the ceramic cylinder, the solder being preferably a silver base alloy. A substantial exterior distance is present between the skirt 39 and the upper end annular member to provide low creepage and good insulation. As there are many techniques used in joining metals to ceramics the method employed here will be apparent to those skilled in the art. Both the cap member 38 and the annular member 34 place the porcelain sleeve 32 in compression which is highly desirable. A terminal member 42 is then soldered to the cap member 38 preferably using a hard solder, such as a silver solder, the terminal member being in alignment with the aperture 37 in the cap. The terminal member 42 has a swageable inner dead-end counterbore 41 in alignment with and opening to the aperture 37 and a swageable outer dead-end counterbore 43 opening to the exterior. A closure 45 separates counterbores 41 and 43. The terminal member may be composed of a metal selected from the group consisting of copper, copper base alloys, silver, silver base alloys, and aluminum and aluminum base alloys.

After the ring member and electrical component are soldered in place, the flanged ferrous base metal header member 30 is disposed so that the flange 35 is in contact with the upper surface of the ring 22. The flange 35 of the annular member 34 is then subjected to a welding electrical current so as to weld it to the circular ring 22 to provide a hermetically sealed chamber. Owing to both the full contact over the entire ring and the small cross-sectional area of contact, very little heat is developed during welding so that the temperature of the electrical component does not rise to a value at which it will deteriorate.

Referring again to FIG. 1, when the device 10 is assembled, an electrical component lead 44 is introduced into the inner dead-end counterbore 41 of the terminal member 42 and subsequently, preferably after welding, may be secured therein by crimping the terminal member about the electrical component lead as is shown in FIG. 1. Similarly, an electrical lead may be secured by crimping in the outer dead-end counterbore 43 opening to the exterior.

Figure 3:
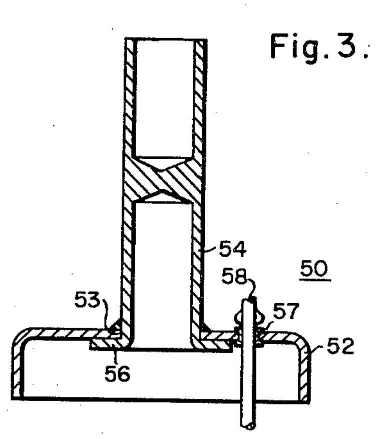
FIG. 3 is a vertical section of a modification of a header member for a sealed electrical device.

With reference to FIG. 3, a modified cap member and the terminal member construction 50 which can be soldered to a ceramic sleeve to form a header member is shown. A cap member 52 is provided with suitable apertures 53 and 57 adapted to receive terminal members 54 and 58, terminal member 58 being essential in producing an electrical device, such as a controlled rectifier or transistor. The construction 50 also employs a modified method of joining terminal member 54 to the cap member 52. The terminal member 54 contains a peripheral flange 56 at the lower end of the inner dead-end counterbore which fits inside the aperture 53. The terminal member 54 is joined to the cap member by soldering the upper surface of the peripheral flange 56 to the interior of the cap member at the aperture 53. The terminal member 58 may be affixed to the cap member 52 by inserting it to the required position in insulated aperture 57 and then applying solder on the upper surface or the lower surface or both of the cap member around the exterior of the terminal member.

The following example is illustrative of the practice of the invention. A 600 volt silicon rectifier unit capable of passing 50 amperes was prepared by silver soldering a ⅜ inch diameter silicon wafer to a ½ inch diameter molybdenum base contact; a counterelectrode of aluminum was soldered to the upper face of the silicon wafer, and a ½ inch diameter molybdenum contact was soldered to the aluminum counterelectrode. A ¼ inch diameter lead was then brazed to the counterelectrode. The silicon rectifier unit was then silver soldered to a flat surface plateau on a copper mounting stud. Concurrently a steel ring approximately ⅞ inch in diameter was soldered into a groove in the flange of the mounting stud.

A header similar to that shown in FIG. 2 was prepared by silver soldering a ¾ inch diameter stainless steel flanged annular member to the exterior of the metallized lower end of a $\frac{9}{16}$ inch diameter open-ended, sleeve-like, cylindrical alumina ceramic member. A ¾ inch diameter copper apertured cap having a downwardly extending skirt was then silver soldered to the exterior of the metallized upper end of the ceramic member. Finally, a ⅜ inch diameter copper terminal was soldered to the cap at the aperture.

The header was then disposed on the support member so that the flange of the annular member was in contact with the upper surface of the ring mounted on the flange of the support member to provide a hermetically sealed chamber. The flange was then subjected to a welding electrical current so as to weld it to the circular ring. Finally, the electrical component lead was secured into the inner dead-end counterbore of the terminal member by crimping the terminal member about the electrical component lead as is shown in FIG. 1.

Since certain changes in the product embodying the invention may be made without departing from its scope, it is intended that the accompanying description and drawing be interpreted as illustrative and not limiting.

I claim as my invention:

1. A header member for a sealed electrical device comprising an open-ended cylindrical porcelain ceramic member; a metallic annular member having a laterally extending flange at the lower end thereof, the annular member circumscribing and hermetically joined to the exterior of the lower end of the cylindrical ceramic member, the flange extending below the end of the cylindrical ceramic member; an apertured cap member having a downwardly extending skirt hermetically joined to the upper end of the ceramic cylinder, a substantial exterior distance being present between the skirt and the annular member to provide good electrical insulation and a long creepage path therebetween; the annular member and the apertured cap member placing the ceramic member in compression, a terminal member hermetically joined to the cap member and in alignment with the aperture in the cap, the terminal member having a swageable inner dead-end counterbore opening to the aperture and a swageable outer dead-end counterbore open to the exterior.

2. A header member for a sealed electrical device comprising an open-ended cylindrical ceramic member composed of a high alumina porcelain; an annular metal member having a laterally extending flange at the lower end thereof, the annular member circumscribing and soldered to the exterior of one end of the cylindrical ceramic member, the flange extending below the end of the cylindrical ceramic member; an apertured metal cap member having a downwardly extending skirt soldered to the upper end of the ceramic cylinder, a substantial exterior distance being present between the skirt and the annular member to provide good electrical insulation and a long creepage path therebetween; the annular member and the apertured cap member placing the ceramic member in compression, a metallic terminal member soldered to the cap member and in alignment with the aperture in the cap, the terminal member having a swageable inner dead-end counterbore opening to the aperture and a swageable outer dead-end counterbore open to the exterior.

3. A sealed electrical device comprising a good thermally conductive support member; a heat sensitive electrical semiconductor component attached to one surface of the support member so that heat may be dissipated to the support member; and a header member comprising an open-ended cylindrical ceramic member, a metallic annular member having a laterally extending flange at the lower end thereof, the annular member circumscribing and hermetically joined by a hard solder to the exterior of the lower end of the cylindrical ceramic member, the flange extending below the end of the cylindrical ceramic member; an apertured cap member having a downwardly extending skirt hermetically joined by a hard solder to the upper end of the ceramic cylinder, a substantial exterior distance being present between the skirt and the annular member to provide good electrical insulation and a long creepage path therebetween; the annular member and the apertured cap member placing the ceramic member in compression, a terminal member hermetically joined to the cap member and in alignment with the aperture in the cap, the terminal member having a swageable inner dead-end counterbore opening to the aperture and a swageable outer dead-end counterbore opens to the exterior, the laterally extending metal flange of the annular member being joined to the surface of the support member to cooperate with the support member to provide a hermetic enclosure for the electrical component in the space between the header member and the support member.

4. A semiconductor device comprising a good thermally conductive support member having a peripheral flange having an upper surface, the support member being a metal selected from the group consisting of copper, copper base alloys, silver, silver base alloys, and aluminum and aluminum base alloys; a heat sensitive electrical semiconductor component mounted on one surface of the support member disposed within the periphery so that heat may be dissipated to the support member, the electrical component being adversely affected by heating to a temperature above a predetermined level; a ferrous base metal ring member hermetically mounted on the upper surface of the peripheral flange of the support member, the ring having a narrow circular projection extending above the upper surface of the flange; and a header member comprising an open-ended cylindrical ceramic member composed of a high alumina porcelain; an annular metal member having a laterally extending flange at the lower end thereof, the annular member circumscribing and soldered to the exterior of one end of the cylindrical ceramic member, the flange extending below the end of the cylindrical ceramic member; an apertured metal cap member, the cap having a downwardly extending skirt soldered to the upper end of the ceramic cylinder, a substantial exterior distance being present between the skirt and the annular member to provide good electrical insulation and a long creepage path therebetween; the annular member and the apertured cap member placing the ceramic member in compression, a metallic terminal member soldered to the cap member and in alignment with the aperture in the cap, the terminal member having a swageable inner dead-end counterbore opening to the aperture and a swageable outer dead-end counterbore open to the exterior, the laterally extending metal flange of the annular member being welded to the circular ring member to cooperate with the support member to provide a hermetic enclosure for the electrical component between the header member and the support member.

5. In a sealed electrical device comprising a support member, a semiconductor element attached to a surface of the support member and an electrical conductor attached to a surface of the semiconductor member, a header member comprising an open-ended cylindrical ceramic member, a metallic annular member circumscribing and hermetically joined to the exterior of the lower end of the cylindrical ceramic member, a portion of the annular member extending below the end of the cylindrical ceramic member, an apertured cap member hermetically joined to the upper end of the ceramic cylinder, a substantial exterior distance being present between the skirt and the annular member to provide good electrical insulation and a long creepage path therebetween, the annular member and the apertured cap member placing the ceramic member in compression, the electrical conductor passing through the aperture in the cap member and being sealed thereto, and the said lower portion of the annular member being joined to the surface of the support member to provide a hermetic enclosure for the semiconductor component.

6. In a sealed electrical device comprising a support member, a semiconductor element attached to a surface of the support member and an electrical conductor attached to a surface of the semiconductor element, a header member comprising an open-ended cylindrical high alumina porcelain ceramic member, a metallic annular member having a laterally extending flange at the lower end thereof, the annular member circumscribing and hermetically joined by a hard solder to the exterior of the lower end of the cylindrical ceramic member, the flange extending below the end of the cylindrical ceramic member, an apertured cap member having a downwardly extending skirt hermetically joined by a hard solder to the upper end of the ceramic cylinder, a substantial exterior distance being present between the skirt and the annular member to provide good electrical insulation and a long creepage path therebetween, the annular member and the apertured cap member placing the ceramic member in compression, the electrical conductor passing through the aperture in the cap member and being sealed therein, the laterally extending metal flange of the annular member being joined to the surface of the support member to provide a hermetic enclosure for a semiconductor element.

References Cited in the file of this patent

UNITED STATES PATENTS

| | | |
|---|---|---|
| 2,780,759 | Boyer et al. | Feb. 5, 1957 |
| 2,889,498 | Boyer et al. | June 2, 1959 |
| 2,917,686 | Boyer et al. | Dec. 15, 1959 |
| 2,933,662 | Boyer et al. | Apr. 19, 1960 |